(12) United States Patent
Matsumoto

(10) Patent No.: US 9,697,981 B2
(45) Date of Patent: Jul. 4, 2017

(54) BLANKING SYSTEM FOR MULTI CHARGED PARTICLE BEAMS, AND MULTI CHARGED PARTICLE BEAM WRITING APPARATUS

(71) Applicant: NuFlare Technology, Inc., Yokohama (JP)

(72) Inventor: Hiroshi Matsumoto, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/879,447

(22) Filed: Oct. 9, 2015

(65) Prior Publication Data

US 2016/0141142 A1     May 19, 2016

(30) Foreign Application Priority Data

Nov. 14, 2014 (JP) ................. 2014-232007

(51) Int. Cl.
*H01J 37/00* (2006.01)
*H01J 37/04* (2006.01)
*H01J 37/317* (2006.01)

(52) U.S. Cl.
CPC ........ *H01J 37/045* (2013.01); *H01J 37/3177* (2013.01); *H01J 2237/0437* (2013.01)

(58) Field of Classification Search
USPC .............................. 250/396 R, 398, 396 ML
See application file for complete search history.

(56) References Cited

U.S. PATENT DOCUMENTS

| 2002/0027198 A1 | 3/2002 | Nagata et al. |
| 2012/0115306 A1* | 5/2012 | Yamazaki ............ B82Y 10/00 438/460 |

FOREIGN PATENT DOCUMENTS

| JP | 3394237 | 4/2003 |
| JP | 2012-182294 | 9/2012 |
| JP | 2013-165199 | 8/2013 |

\* cited by examiner

*Primary Examiner* — Nicole Ippolito
*Assistant Examiner* — Hanway Chang
(74) *Attorney, Agent, or Firm* — Oblon, McClelland, Maier & Neustadt, L.L.P.

(57) ABSTRACT

A blanking system for multi charged particle beams includes a blanking aperture array device to include a first substrate where a plurality of openings corresponding to passage positions of multi-beams are formed in a penetrating manner from the upper surface, and a plurality of electrode groups each having a pair of electrodes which are close to a corresponding one of the plurality of openings and are at opposite sides, on a same surface, of the corresponding one of the plurality of openings are arranged on the first substrate, a second substrate whose lower surface is electrically connected through a bump to the upper surface of the first substrate, and a mounting substrate whose upper surface is electrically connected through a bump to the lower surface of the second substrate.

8 Claims, 9 Drawing Sheets

BLANKING SYSTEM FOR MULTI CHARGED PARTICLE BEAMS, AND MULTI CHARGED PARTICLE BEAM WRITING APPARATUS

CROSS-REFERENCE TO RELATED APPLICATION

This application is based upon and claims the benefit of priority from the prior Japanese Patent Application No. 2014-232007 filed on Nov. 14, 2014 in Japan, the entire contents of which are incorporated herein by reference.

BACKGROUND OF THE INVENTION

Field of the Invention

Embodiments of the present invention relate generally to a blanking system for multi charged particle beams, and a multi charged particle beam writing apparatus, and more specifically, to a blanking system in multi-beam writing, for example.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. The electron beam writing technique, which intrinsically has excellent resolution, is used for writing or "drawing" a pattern on a wafer, etc. with electron beams.

As an example employing the electron beam writing technique, a writing apparatus using multiple beams (multi-beams) can be cited. Compared with the case of writing a pattern by using a single electron beam, since it is possible to emit multiple beams at a time in multi-beam writing, the throughput can be greatly increased. For example, in a writing apparatus employing a multi-beam system, multi-beams are formed by letting portions of an electron beam emitted from an electron gun pass through a corresponding hole of a plurality of holes in the mask, each of the beams is blanking-controlled, and each unblocked beam is reduced by an optical system and deflected by a deflector so as to irradiate a desired position on a target object or "sample".

In multi-beam writing, the dose of each beam is separately controlled based on an irradiation time. For highly accurately controlling such a dose of each beam, it is necessary to perform high speed blanking control to provide an ON or OFF state of each beam. In a writing apparatus of a multi-beam system, a blanking control circuit for each beam is mounted on a blanking aperture array (BAA) where respective blankers for multi-beams are arranged. A control signal is output to the control circuit for each of these beams.

The throughput of a multi-beam writing apparatus is rate controlled determined by data transmission to the blanking aperture array. Conventionally, it is common that signal connection is performed by wire bonding between a blanking aperture array and an mounting substrate on which a blanking aperture array is mounted. However, the wire bonding has a problem in that impedance mismatch may easily occur. This leads to a problem in that it is difficult to perform a clock operation at high speed in data transmission. Furthermore, it is difficult to have a large installation density in order to avoid contact between wires, and therefore, it has no choice but to increase the number of control circuits for individual beams each controlled by one signal line. Therefore, the number of times of clock operation in data transmission required for one shot increases, which causes a problem of becoming an obstacle to increase a data transmission rate.

As a technique relevant to a blanking system, there is disclosed a technique in which a plurality of blankers (electrodes) are connected in parallel to one circuit where a shift register and a switch are arranged, and a plurality of circuits each having this structure are connected in order to one data line, so as to perform data transmission (e.g., refer to Japanese Patent No. 3394237).

BRIEF SUMMARY OF THE INVENTION

According to one aspect of the present invention, a blanking system for multi charged particle beams includes a blanking aperture array device configured to include a first substrate where a plurality of openings corresponding to passage positions of multi-beams are formed in a penetrating manner from an upper surface, and a plurality of electrode groups each having a pair of electrodes which are close to a corresponding one of the plurality of openings and are at opposite sides, on a same surface, of the corresponding one of the plurality of openings are arranged on the first substrate, a second substrate whose lower surface is electrically connected through a bump to an upper surface of the first substrate, and a mounting substrate whose upper surface is electrically connected through a bump to a lower surface of the second substrate.

According to another aspect of the present invention, a blanking system for multi charged particle beams includes a blanking aperture array device configured to include a first substrate where a plurality of openings corresponding to passage positions of multi-beams are formed in a penetrating manner from an upper surface, and a plurality of electrode groups each having a pair of electrodes which are close to a corresponding one of the plurality of openings and are at opposite sides, on a same surface, of the corresponding one of the plurality of openings are arranged on the first substrate, a second substrate whose lower surface is electrically connected through a bump to an upper surface of the first substrate, a third substrate on which an FPGA (Field Programmable Gate Array) having a function of converting a differential signal into a single-ended signal is mounted, and a mounting substrate whose upper surface is electrically connected through a bump to lower surfaces of the second substrate and the third substrate.

According to yet another aspect of the present invention, a multi charged particle beam writing apparatus includes a stage configured to mount a target object thereon and to be continuously movable, an emitter configured to emit a charged particle beam, a multi beam forming member, in which a plurality of openings are formed, configured to form multi-beams by making a region including a whole of the plurality of openings be irradiated by the charged particle beam and by making portions of the charged particle beam individually pass through a corresponding one of the plurality of openings, a blanking system configured to perform blanking control of the multi-beams, and a limiting aperture member configured to block each beam having been deflected to be in an off state by the blanking system, wherein the blanking system includes a blanking aperture array device configured to include a first substrate where a plurality of openings corresponding to passage positions of multi-beams are formed in a penetrating manner from an upper surface, and a plurality of electrode groups each having a pair of electrodes which are close to a corresponding one of the plurality of openings and are at opposite sides, on a same surface, of the corresponding one of the plurality of openings are arranged, a second substrate whose lower surface is electrically connected through a bump to an upper surface of the first substrate, and a mounting substrate whose upper surface is electrically connected through a bump to a lower surface of the second substrate.

DETAILED DESCRIPTION OF THE INVENTION

In the embodiments below, there will be described a writing apparatus and a blanking system which can reduce impedance mismatch and in which an installation density can be increased.

In the embodiments below, there will be described a configuration in which an electron beam is used as an example of a charged particle beam. The charged particle beam is not limited to the electron beam, and other charged particle beam such as an ion beam may also be used.

First Embodiment

Figure 1:
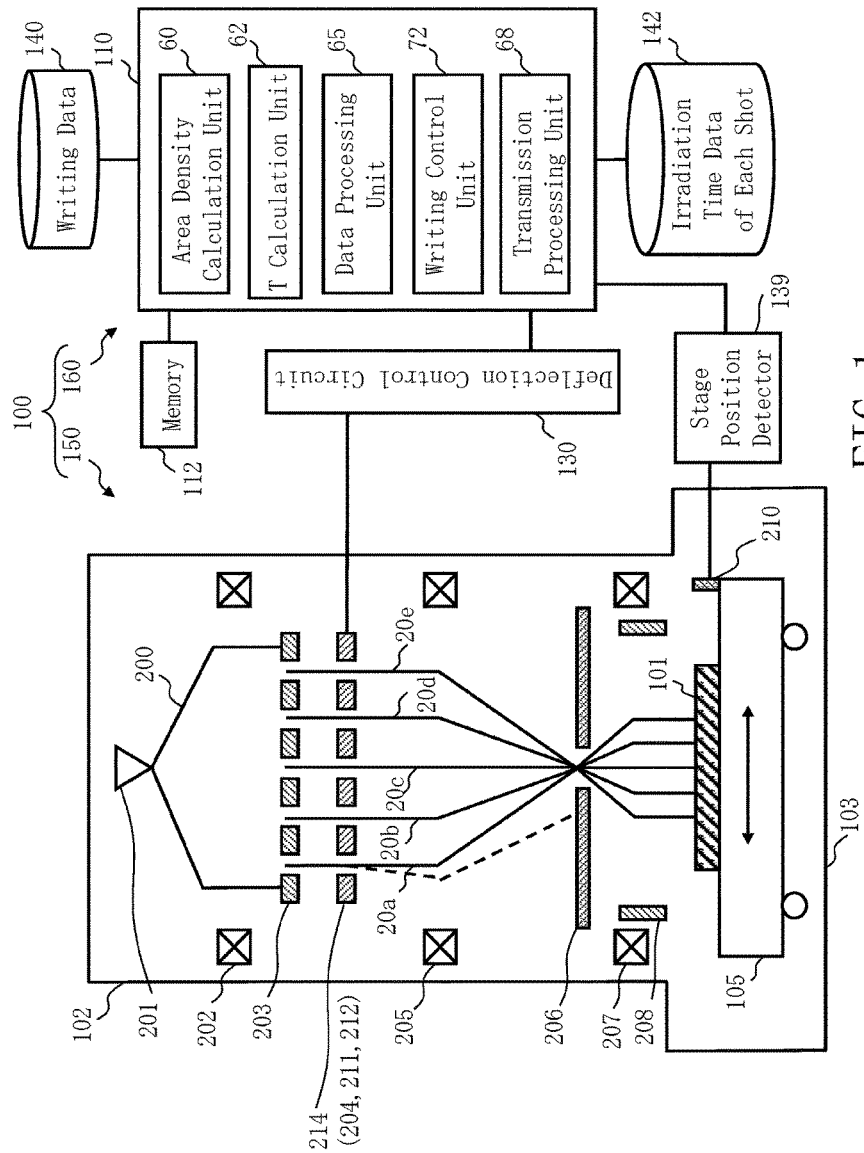
FIG. 1 is a schematic diagram showing a configuration of a writing apparatus according to a first embodiment.

FIG. 1 is a schematic diagram showing a configuration of a writing or "drawing" apparatus according to the first embodiment. As shown in FIG. 1, a writing apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun 201, an illumination lens 202, a forming aperture array member 203, a blanking system 214, a reducing lens 205, a limiting aperture member 206, an objective lens 207, and a deflector 208. In the writing chamber 103, an XY stage 105 is arranged. On the XY stage 105, there is placed a target object or "sample" 101 such as a mask serving as a writing target substrate when writing is performed. For example, the target object 101 is an exposure mask used for manufacturing semiconductor devices, or is a semiconductor substrate (silicon wafer) on which semiconductor elements are formed. The target object 101 may be, for example, a mask blank on which resist has been applied and nothing has yet been written. Moreover, a mirror 210 for measuring the position of the XY stage 105 is arranged on the XY stage 105.

The control unit 160 includes a control computer 110, a memory 112, a deflection control circuit 130, a stage position detector 139, and storage devices 140 and 142 such as magnetic disk drives. The control computer 110, the memory 112, the deflection control circuit 130, the stage position detector 139, and the storage devices 140 and 142 are connected with each other through a bus (not shown). Writing data is input into the storage device 140 from the outside the writing apparatus 100, and stored therein.

In the control computer 110, there are arranged an area density calculation unit 60, an irradiation time T calculation unit 62, a data processing unit 65, a writing control unit 72, and a transmission processing unit 68. A series of "units" such as the area density calculation unit 60, the irradiation time T calculation unit 62, the data processing unit 65, the writing control unit 72, and the transmission processing unit 68 is formed and performed by at least one circuit, such as at least one electric circuit, at least one computer, at least one processor, at least one circuit substrate, or at least one semiconductor device. Data which is input and output to/from the area density calculation unit 60, irradiation time T calculation unit 62, data processing unit 65, writing control unit 72, and transmission processing unit 68, and data being operated are stored in the memory 112 each time.

FIG. 1 shows a configuration necessary for explaining the first embodiment. Other configuration elements generally necessary for the writing apparatus 100 may also be included.

Figure 2A:
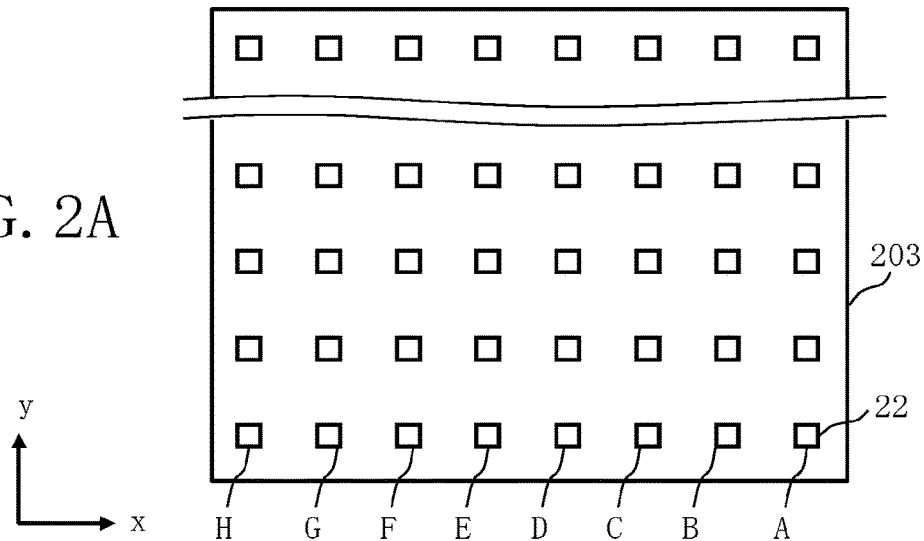
FIGS. 2A and 2B are conceptual diagrams each showing a configuration of a forming aperture array member according to the first embodiment.
Figure 2B:
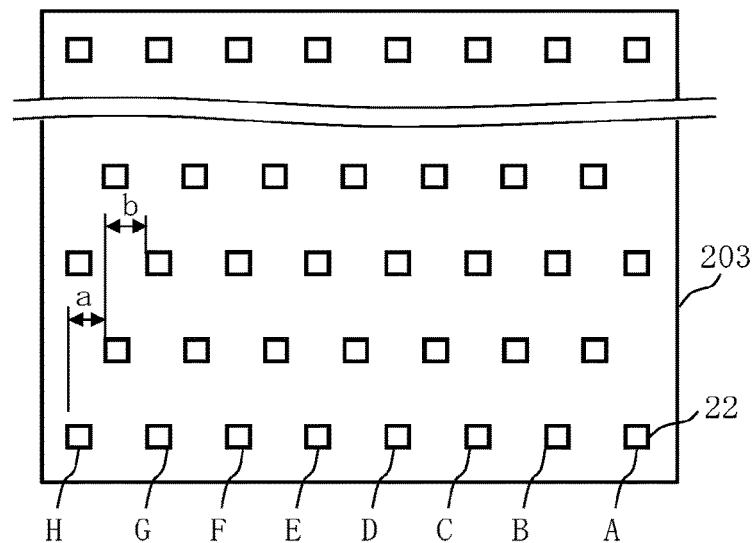

FIGS. 2A and 2B are conceptual diagrams each showing an example of the configuration of a forming aperture array member according to the first embodiment. As shown in FIG. 2A, holes (openings) 22 of m rows long (y direction) and n columns wide (x direction) (m≥2, n≥2) are formed, like a matrix, in the forming aperture array member 203 at a predetermined arrangement pitch. In FIG. 2A, for example, holes 22 of 512 (rows)×8 (columns) are formed. Each of the holes 22 is a quadrangle of the same dimensional shape. Alternatively, each of the holes 22 can be a circle of the same circumference. Here, there is shown an example in which each of the rows arrayed in the y direction has eight holes 22 from A to H in the x direction. Multi-beams 20 are formed by letting portions of an electron beam 200 individually pass through a corresponding hole of a plurality of holes 22. The case in which the holes 22 of two or more rows and columns are arranged in both the x and the y directions is shown here, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. Moreover, the method of arranging the holes 22 is not limited to the case of FIG. 2A where holes are arranged like a grid in the length and width directions. For example, as shown in FIG. 2B, as to the first and second rows arrayed in the length direction (y direction), each hole in the first row and each hole in the second row may be mutually displaced in the width direction (x direction) by a dimension "a". Similarly, as to the second and third rows arrayed in the length direction (y direction), each hole in the second row and each hole in the third row may be mutually displaced in the width direction (x direction) by a dimension "b", for example.

Figure 3:
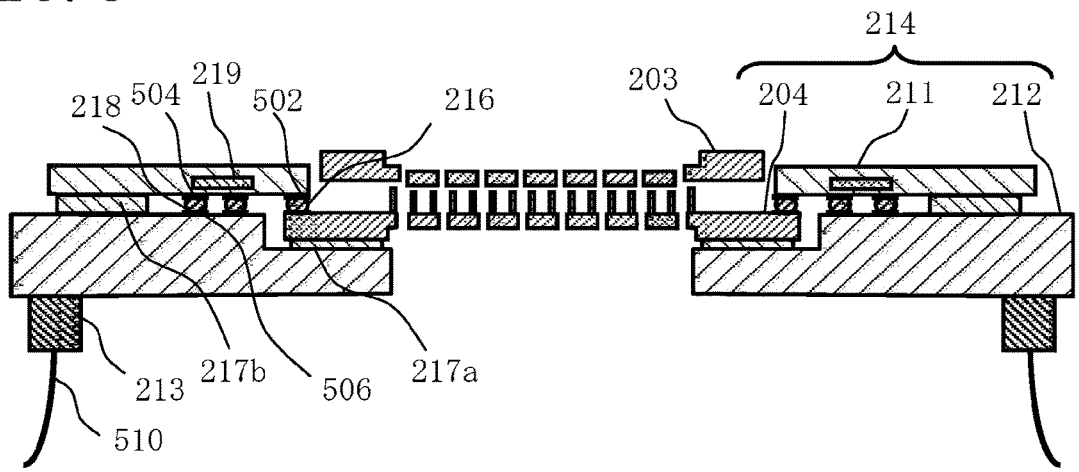
FIG. 3 is a sectional view showing a structure of a blanking system according to the first embodiment.
Figure 4:
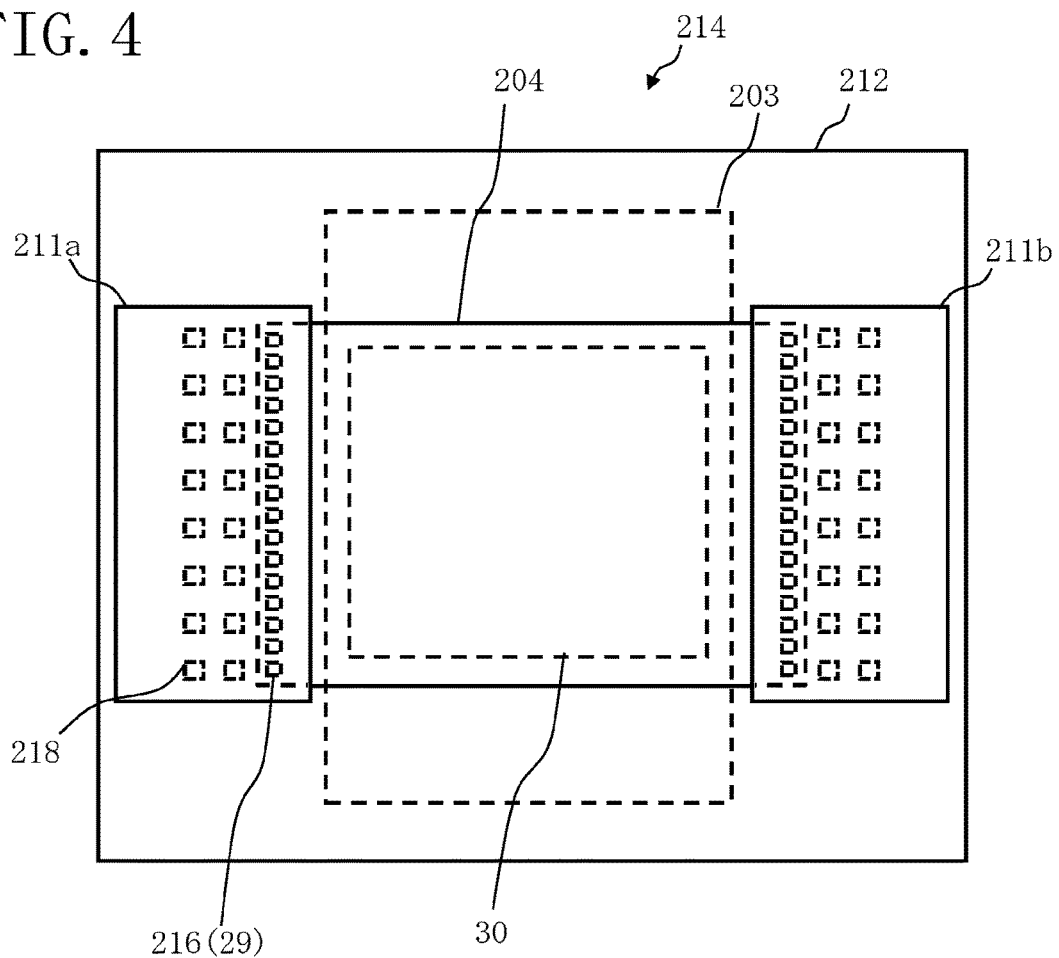
FIG. 4 is a top view showing a configuration of a blanking system according to the first embodiment.

FIG. 3 is a sectional view showing a structure of a blanking system according to the first embodiment. FIG. 4 is a top view showing a configuration of a blanking system according to the first embodiment. In FIGS. 3 and 4, the blanking system 214 for multi-beams according to the first embodiment includes a blanking aperture array device 204, a circuit substrate 211 (second substrate), and a mounting substrate 212. The substrate central part of the blanking aperture array device 204 is shaved from the back side and processed to be a membrane region 30 (first region) having a thin film thickness, to be described later. Then, in the membrane region 30, passage holes (openings) through each of which a corresponding one of multi-beams passes and a pair of electrodes for deflecting each beam are arranged. The central part of the mounting substrate 212 is open, and the blanking aperture array device 204 is arranged on the mounting substrate 212 such that the membrane region 30 is located at the central opening. The lower surface of the circuit substrate 211 is electrically connected through a bump 216 to the substrate upper surface of the blanking aperture array device 204. The upper surface of the mounting substrate 212 is electrically connected through a bump 218 to the lower surface of the circuit substrate 211. A connector 213 is connected to the backside of the mounting substrate 212, and a wiring 510 for transmitting signals to the mounting substrate 212 is connected by the connector 213 to a wiring (not shown) in the mounting substrate 212. Assuming that the minimum wiring pitch on the blanking aperture array device 204 is smaller than the wiring pitch on the mounting substrate 212 in FIG. 4, wiring is connected through the circuit substrate 211 to pads arrayed in two rows on the mounting substrate 212 from pads arrayed in a line on the blanking aperture array device 204. The pad arrangement is not limited thereto, and it may be arrayed in two or three rows on the aperture array device 204, or in several rows arbitrarily on the mounting substrate 212.

Figure 5:
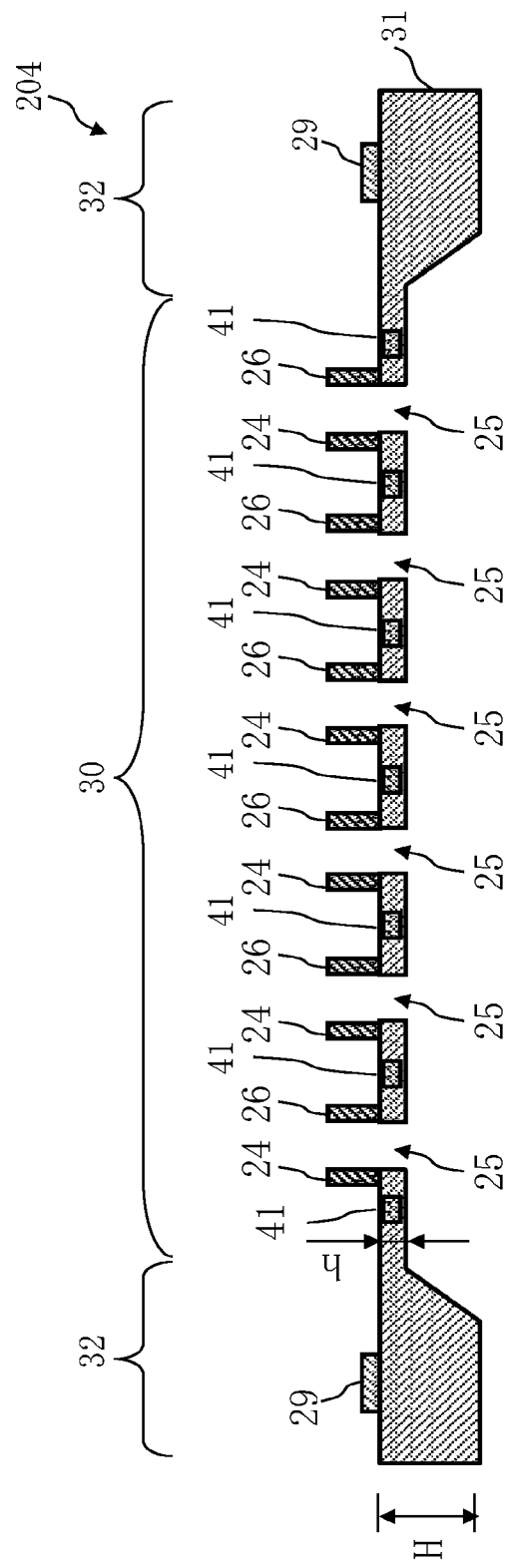
FIG. 5 is a sectional view showing a configuration of a blanking aperture array device according to the first embodiment.
Figure 6:
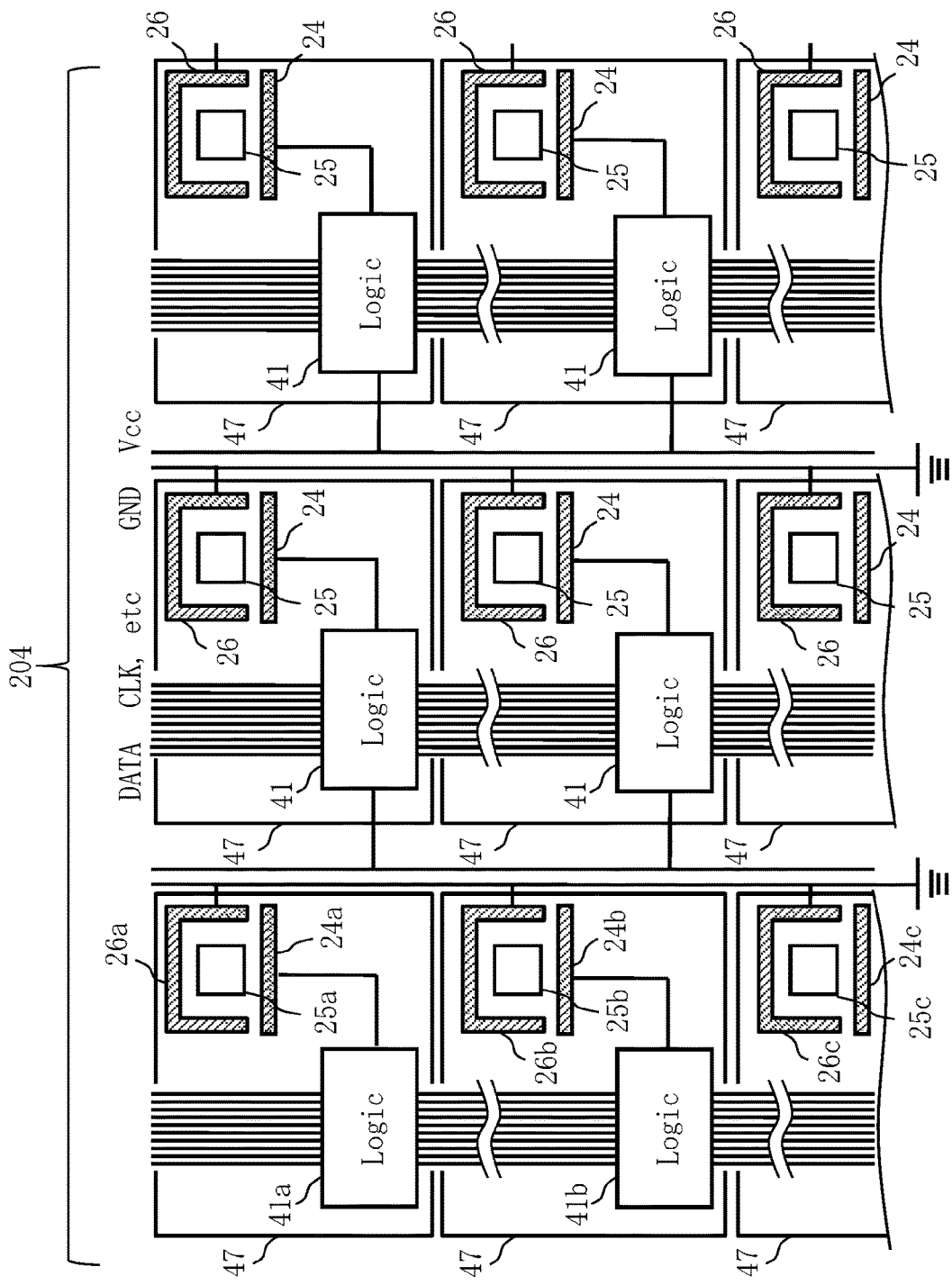
FIG. 6 is a top view conceptual diagram showing a part of the configuration in a membrane region of a blanking aperture array device according to the first embodiment.

FIG. 5 is a sectional view showing a configuration of a blanking aperture array device according to the first embodiment. FIG. 6 is a top view conceptual diagram showing a part of the configuration in a membrane region of a blanking aperture array device according to the first embodiment. In FIGS. 5 and 6, the positions of electrodes 24 and 26 and the position of a control circuit 41 are not in accordance with each other. The blanking aperture array device 204 is formed by using a semiconductor substrate 31 (first substrate) made of silicon, etc., as shown in FIG. 5. The central part of the substrate 31 is shaved from the back side and processed to be a membrane region 30 (first region) whose thin film thickness is h. The circumference surrounding the membrane region 30 is a circumference region 32 (second region) whose thick film thickness is H. The upper surface of the membrane region 30 and the upper surface of the circumference region 32 are formed to have equal height positions, or substantially equal height positions. At the backside of the circumference region 32, the substrate 31 is supported to be on the mounting substrate 212, as shown in FIG. 3.

In the membrane region 30, there are formed passage holes 25 (openings), through each of which a corresponding one of multi-beams passes, at the positions each corresponding to each hole 22 of the forming aperture array member 203 shown in FIGS. 2A and 2B. In other words, a plurality of passage holes 25 corresponding to passage positions of the multi-beams 20 are formed, in a penetrating manner from the upper surface, in the substrate 31. Then, as shown in FIGS. 5 and 6, pairs of electrodes 24 and 26 (electrode group being a pair: also called a blanker or a blanking deflector) for blanking deflection are arranged in the membrane region 30, where each of the pairs is close to a corresponding passage hole 25 in a manner such that the electrodes 24 and 26 are at opposite sides, on the same surface of the membrane region 30, of the corresponding passage hole 25. In other words, a plurality of electrode groups each composed of a pair of electrodes 24 and 26 at opposite sides of a corresponding one of a plurality of passage holes 25 are arranged on the substrate 31, in the blanking aperture array device 204.

Moreover, close to each passage hole 25 in the membrane region 30, there is arranged a control circuit 41 (logic circuit) which applies a deflection voltage to one of the electrodes (for example, electrode 24) for each passage hole 25. The control circuit 41 and electrodes 24 and 26 are fabricated using the semiconductor manufacturing technology and MEMS (micro-electro-mechanical system) technology. One (for example, electrode 24) of the two electrodes 24 and 26 for each beam is connected to the control circuit 41, and the other one (for example, electrode 26) is grounded (earthed). Further, as shown in FIG. 6, for example, 10-bit parallel lines for control signals are connected to each control circuit 41. In addition to the 10-bit parallel lines, for example, a clock signal line and a power supply line are connected to each control circuit 41. A part of the parallel lines may be used as the clock signal line and the power supply line. An individual blanking system 47 composed of the electrodes 24 and 26 and the control circuit 41 is configured for each of multi-beams.

Moreover, as shown in FIG. 5, a plurality of pads 29 (first pad) for receiving control signals are arranged in the circumference region 32 having a thick film thickness. A plurality of pads 29 are arranged along the two sides, for example, right and left, of the four sides of the quadrangular membrane region 30 of the blanking aperture array device 204, as shown in FIG. 4. A plurality of pads 29 on the substrate 31 of the blanking aperture array device 204 and a plurality of pads 502 (second pad) formed on the lower surface of the circuit substrate 211 are connected by the bump 216 as shown in FIG. 3.

A blanking signal for performing blanking control of a corresponding beam of the multi-beams 20, using an electrode group of the pair of electrodes 24 and 26, is transmitted in the order of the mounting substrate 212, the circuit substrate 211, and the semiconductor substrate 31.

With respect to data transmission of blanking signals, the differential signaling (for example, LVDS: low voltage differential signaling) method is more effective in high-speed operation than the single-ended method. The differential signaling method is used in the first embodiment. On the other hand, signals based on the single-ended method are used in the control circuit 41 of the blanking aperture array device 204. Therefore, it is necessary to prepare a conversion unit for converting a differential signal into a single-ended signal is needed. In the differential signaling method, heat is generated since the current flows in the termination resistance. Therefore, according to the first embodiment, a conversion circuit 219 (conversion unit: also called a receiver) that converts a differential signal into a single-ended signal is formed for each beam group to be described later in the circuit substrate 211 not in the blanking aperture array device 204. Thereby, heat generation in the blanking aperture array device 204 can be reduced. On the other hand, as shown in FIG. 3, the heat generated in the circuit substrate 211 can be dissipated to the mounting substrate 212 side by performing a thermal connection between the circuit substrate 211 and the mounting substrate 212 by using a paste material 217b, etc. Further, it is more preferable to dissipate heat to the mounting substrate 212 side by performing a thermal connection between the blanking aperture array device 204 and the mounting substrates 212 by using a paste material 217a, etc.

In the conversion circuit 219, a differential amplifier that inputs two signals of the differential signal, and converts them into single-ended signals is arranged. Two signal lines of the differential signal are connected each other through the termination resistance in the differential amplifier. On the lower surface of the circuit substrate 211, there is formed a pair of pads 504 for inputting a differential signal for each shift register line arranged for each beam array line, for example. If data is transmitted to shift registers in a plurality of lines from a serial-parallel converter by arranging the serial-parallel converter in front of the shift register line, it is sufficient to form one pair of pads for inputting a differential signal, for each serial-parallel converter. Therefore, a plurality of pads 504 (third pad) for inputting differential signals of multi-beams are formed on the lower surface of the circuit substrate 211. A plurality of pads 504 for inputting differential signals on the lower surface of the circuit substrate 211 and a plurality of pads 506 (fourth pad) formed on the upper surface of the mounting substrate 212 are connected through the bumps 218 as shown in FIG. 3. The input side of the conversion circuit 219 of each group should be electrically connected to a corresponding one of a plurality of pads 504 (third pad) formed on the lower surface of the circuit substrate 211. The output side of the conversion circuit 219 of each group should be electrically connected to a corresponding one of a plurality of pads 502 (second pad) formed on the lower surface of the circuit substrate 211. A plurality of pads 506 of the mounting substrate 212 are connected to the wiring 510 that transmits signals from the deflection control circuit 130.

Figure 7:
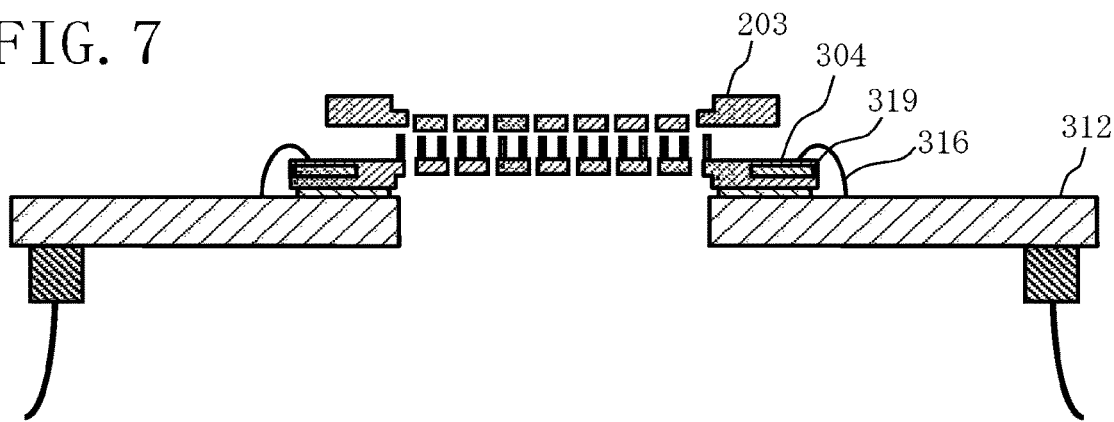
FIG. 7 shows a structure of a blanking system according to a comparative example (1) of the first embodiment.

FIG. 7 shows a structure of a blanking system according to a comparative example (1) of the first embodiment. In the comparative example (1) shown in FIG. 7, a blanking aperture array device 304 is arranged on a mounting substrate 312, and wiring connection is performed by wire bonding. With this structure, as described above, impedance mismatch occurs easily. Therefore, it is difficult to perform a clock operation at high speed in data transmission. Furthermore, it is difficult to have a large installation density, and therefore, it has no choice but to increase the number of control circuits for individual beams each controlled by one signal line. Consequently, the number of times of clock operation in data transmission required for one shot increases, which causes a problem of becoming an obstacle to increase a data transmission rate. Moreover, heightwise restriction is needed so that the wire bonding may not contact the forming aperture array member 203. Alternatively, the wire bonding connection needs to be performed at the position sufficiently distant from the forming aperture array member 203. Furthermore, in the wire bonding, there is a restriction on the arrangement pitch of the pad 29 in order to avoid wire contact, and another restriction on the pad 29 to be arranged in one dimension, such as in one or two lines. It may be possible that the pads are arranged in four or eight lines if a wire is set to extend to another wire, which is not realistic when considering matching of impedance. Moreover, according to the comparative example (1), a conversion circuit 319 that converts a differential signal into a single-ended signal is formed in the blanking aperture array device 304. Therefore, the amount of heat generated in the blanking aperture array device 304 becomes large.

By contrast, according to the first embodiment, since the bump connection is performed, impedance mismatch can be reduced. Therefore, a clock operation in data transmission can be performed at high speed. Moreover, as shown in FIG. 4, the wiring pitch of the circuit substrate 211 is smaller than the wire pitch of wire bonding, and therefore, the pads 216 and 218 can be arranged in two dimensions. Furthermore, the wiring in the circuit substrate 211 can be multilayered. Therefore, the installation density of the pads can be increased. Moreover, according to the first embodiment, since the bump connection is performed, the position of the bump 216 that connects the circuit substrate 211 and the blanking aperture array device 204 can be located lower than the lower surface of the forming aperture array member 203. Thus, an electric short circuit can be avoided. Moreover, as described above, the heat generation problem by a differential signal can be solved because the circuit substrate 211 is provided in addition to the blanking aperture array device 204.

Figure 8:
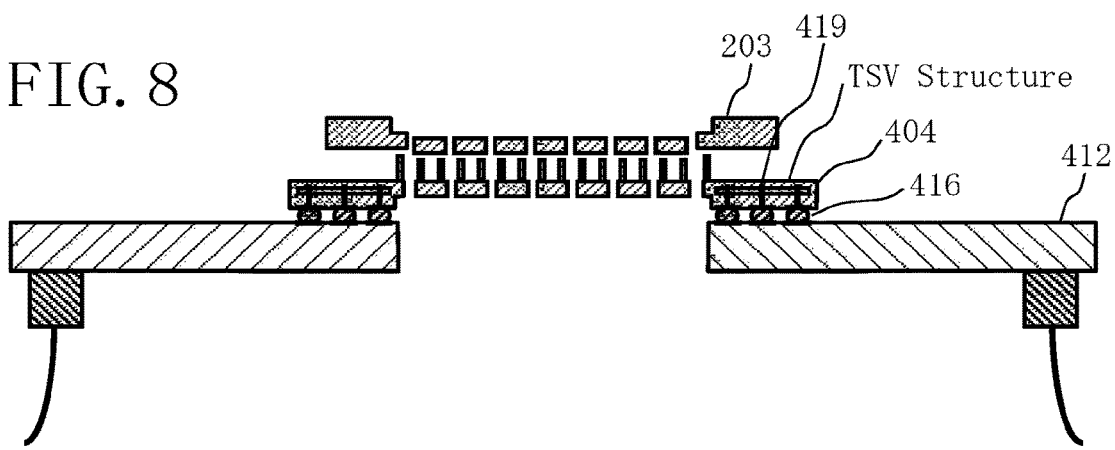
FIG. 8 shows a structure of a blanking system according to a comparative example (2) of the first embodiment.

FIG. 8 shows a structure of a blanking system according to a comparative example (2) of the first embodiment. In the comparative example (2) shown in FIG. 8, a blanking aperture array device 404 is arranged on a mounting substrate 412, and wiring connection is performed by a bump 416. It is necessary in this structure to form contact wiring (TSV (through-silicon via) structure) which penetrates from the control circuit for each beam in the blanking aperture array device 404 to the pad connected to the bump 416 on the lower surface of the blanking aperture array device 404. Then, in order to support the membrane region whose center portion has a thin film thickness, it is necessary to leave the film thickness of its circumferential substrate about 500 μm or more. However, it is difficult to form the TSV structure to have such a thick film thickness. Moreover, in the comparative example (2), a conversion circuit 419 that converts a differential signal into a single-ended signal is formed in the blanking aperture array device 404. Accordingly, the amount of heat generated in the blanking aperture array device 404 becomes large.

By contrast, according to the first embodiment, since the circuit substrate 211 is provided in addition to the blanking aperture array device 204, it is sufficient to form a necessary circuit near the upper surface of the blanking aperture array device 204. With respect to the circuit substrate 211, it is sufficient to form a necessary circuit on the lower surface of the circuit substrate 211. Thus, since it is sufficient to form a necessary circuit on the one side, the TSV structure can be unnecessary. Moreover, as described above, the heat generation problem by a differential signal can be solved because the circuit substrate 211 is provided in addition to the blanking aperture array device 204.

Figure 9:
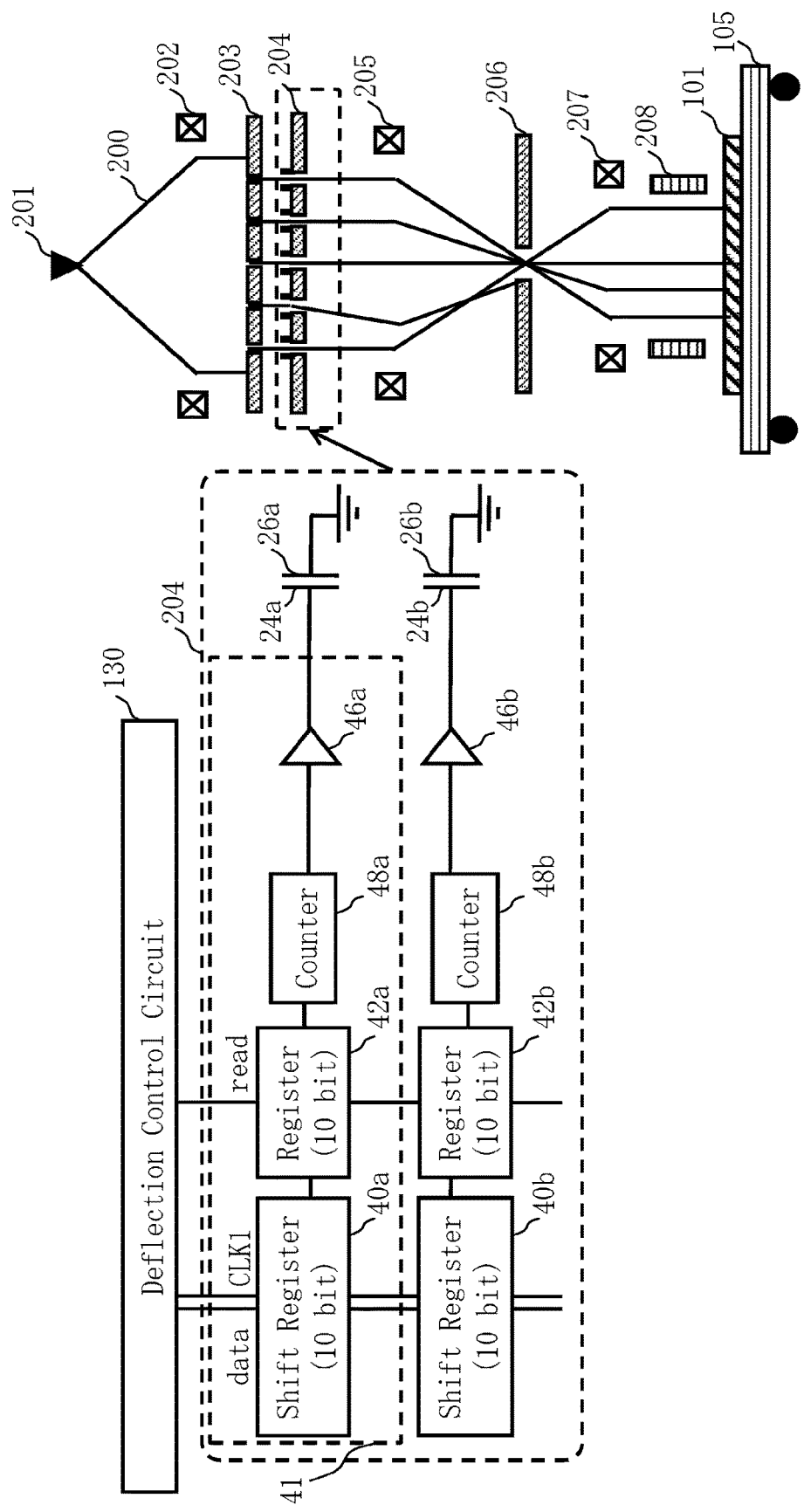
FIG. 9 is a schematic diagram showing the internal configuration of an individual blanking control circuit according to the first embodiment.

FIG. 9 is a schematic diagram showing the internal configuration of an individual blanking control circuit according to the first embodiment. In FIG. 9, in each control circuit 41 for individual blanking control arranged at the blanking aperture array device 204 inside the body of the writing apparatus 100, there are arranged a shift register 40, a register 42, a counter 48, and an amplifier 46. According to the first embodiment, individual blanking control for each beam is controlled by a 10-bit control signal, for example. According to the first embodiment, in the individual blanking systems 47 of m rows long (y direction) and n columns wide (x direction) (m≥2, n≥2) arranged in the membrane region 30 of the blanking aperture array device 204, the shift registers 40 of n individual blanking systems 47 in the same row, for example, are connected in series to be connected to one pad. Therefore, if there are m rows, m groups each composed of the shift registers 40 connected in series are formed. For one-time shot of multi-beams, in accordance with a clock operation, n data signals are transmitted to the head shift registers 40 of respective groups from respective pads 29, and then, sequentially transmitted to each of the shift registers 40 connected in series in the same row. Thus, by performing clock operations n times, data necessary for each shift register 40 is stored. Then, such a data signal is stored in the register 42, the counter 48 counts the period of data ON, and, in the meanwhile, the amplifier 48 applies a deflection voltage to the electrode 24.

In the blanking aperture array device 204 according to the first embodiment, the electron beam 20 passing through a corresponding passage hole 25 is deflected by a voltage independently applied to the two electrodes 24 and 26 being a pair. In the example of FIG. 9, a deflection voltage is applied from the amplifier 48 to the electrode 24. The electrode 26 is grounded. Each beam is blanking-controlled by beam deflection due to a potential difference between the two electrodes 24 and 26. In other words, each of a plurality of blankers performs blanking deflection of a corresponding beam of the multi-beams 20 each controlled through the shift register 40 for a corresponding beam in a plurality of shift registers 40. Thus, a plurality of blankers individually perform blanking deflection of a corresponding beam of the multi-beams having passed through a plurality of holes 22 (openings) of the forming aperture array member 203.

Then, by using the writing apparatus 100 in which the blanking system 214 according to the first embodiment as described above is mounted, patterns are written on the target object 101.

In the pattern area density calculation step, the area density calculation unit 60 reads writing data from the storage device 140, and calculates the area density of a pattern arranged in the writing region of the target object 101 or in each pixel region (mesh region) of a plurality of mesh regions obtained by virtually dividing a chip region to be written into meshes. For example, the writing region of the target object 101 or a chip region to be written is divided into strip-shaped stripe regions each having a predetermined width. Then, each stripe region is virtually divided into a plurality of pixel regions described above. It is preferable that the size of the pixel region is, for example, a beam size, or smaller than the beam size. For example, the size of the pixel region is preferably about 10 nm. The area density calculation unit 60 reads corresponding writing data from the storage device 140 for each stripe region, and assigns a plurality of figure patterns defined in the writing data to a pixel region, for example. Then, the area density of a figure pattern arranged in each pixel region is to be calculated.

In the shot time period (irradiation time) T calculation step, the irradiation time calculation unit 62 calculates an irradiation time T (which hereinafter will also be called a shot time period or an exposure time) of the electron beam per shot, for each predetermined sized pixel region. When performing multiple writing, an irradiation time T of the electron beam per shot in each hierarchy (or "each writing process") of the multiple writing is to be calculated. It is preferable to obtain an irradiation time T, being a reference, to be in proportion to the area density of a calculated pattern. Moreover, it is preferable that the irradiation time T to be finally calculated is a time equivalent to a dose after correction, that is a dose having been corrected with respect to a dimension change amount for a phenomenon causing dimension variations, such as a proximity effect, a fogging effect, or a loading effect not shown. The irradiation time T for each pixel region is defined in an irradiation time map, and the irradiation time map is stored in the storage device 142, for example.

In the irradiation time arrangement data processing step, a data processing unit 64 assigns a pixel region to be irradiated by each of the multi-beams in each shot, along preset writing sequence. Then, the data processing unit 64 reads data of an irradiation time for a pixel region concerned from the storage device 142, converts the data of the irradiation time of a corresponding beam to 10-bit data, for each group of shift registers connected in series, and performs processing so that the data may be aligned according to the transmission order transmitted by a plurality of shift registers 40 in a corresponding group. The arrangement processing is performed such that data may be aligned in order from the data for a shift register at the posterior side in a plurality of shift registers connected in series in a group.

In the irradiation time arrangement data output step, the transmission processing unit 68 outputs, for each shot of multi-beams, irradiation time arrangement data in which data of each group is aligned in order and which has been processed to be in accordance with the arrangement of a plurality of shift registers connected in series in each group, to the deflection control circuit 130.

In the data transmission step, for each shot of multi-beams, the deflection control circuit 130 transmits irradiation time arrangement data of each group, as a differential signal, to the mounting substrate 212. Then, the data is transmitted to the circuit substrate 211 from the mounting substrate 212. In the circuit substrate 211, the irradiation time arrangement data of each group is converted into a single-ended signal from a differential signal by the conversion circuit 219 of each group. The single-ended signal of each group is transmitted to the head shift register 40 in a corresponding group through the pad 29 of each group in the blanking aperture array device 204, and sequentially transmitted to each of the shift registers 40 connected in series in a group. Then, as described above, blanking control of each beam is performed. The signal having been serially transmitted from the pad 29 is converted into a 10-bit parallel signal by a serial parallel conversion unit (not shown), and data of the 10-bit parallel signal is transmitted to a corresponding control circuit 41.

The writing unit 150 performs writing based on an irradiation time concerned, for each shot of multi-beams. Specifically, it operates as described below.

The electron beam 200 emitted from the electron gun 201 (emitter) almost perpendicularly (e.g., vertically) illuminates the whole of the forming aperture array member 203 by the illumination lens 202. A plurality of holes (openings) each being a quadrangle are formed in the forming aperture array member 203. The region including all the plurality of holes is irradiated by the electron beam 200. For example, a plurality of quadrangular electron beams (multi-beams) 20a to 20e are formed by making portions of the electron beam 200 irradiating the positions of a plurality of holes individually pass through a corresponding hole of the plurality of holes of the forming aperture array member 203. The multi-beams 20a to 20e individually pass through a corresponding electrode pair (also called a blanker or a blanking deflector) of the blanking aperture array device 204. Each electrode pair deflects (performs blanking deflection) the electron beam 20 which is individually passing.

The multi-beams 20a, 20b, . . . , 20e having passed through the blanking aperture array device 204 are reduced by the reducing lens 205, and go toward the hole in the center of the limiting aperture member 206. At this stage, the electron beam 20 which was deflected by the electrode pair of the blanking aperture array device 204 deviates from the hole in the center of the limiting aperture member 206 (blanking aperture member) and is blocked by the limiting aperture member 206. On the other hand, the electron beam 20 which was not deflected by the blanker of the blanking aperture array device 204 passes through the hole in the center of the limiting aperture member 206, as shown in FIG. 1. Blanking control is performed by ON/OFF of the individual blanking mechanism so as to control ON/OFF of beams. Thus, the limiting aperture member 206 blocks each beam which was deflected to be a beam OFF state by the individual blanking mechanism. Then, a beam of one shot is formed by a beam having been made during from a beam ON state to a beam OFF state and having passed through the limiting aperture member 206. The multi-beams 20 having passed through the limiting aperture member 206 are focused by the objective lens 207 in order to be a pattern image of a desired reduction ratio, and respective beams (the entire multi-beams 20) having passed through the limiting aperture member 206 are collectively deflected in the same direction by the deflector 208 in order that respective beam irradiation positions on the target object 101 are irradiated. While the XY stage 105 is continuously moving, controlling is performed by the deflector 208 so that irradiation positions of beams may follow the movement of the XY stage 105, for example. The position of the XY stage 105 is measured by way of radiating a laser from the stage position detector 139 to the mirror 210 on the XY stage 105 and using the catoptric light for the measurement. The multi-beams 20, irradiation at a time, are ideally aligned at pitches obtained by multiplying the arrangement pitch of a plurality of holes of the forming aperture array member 203 by a desired reduction ratio described above. The writing apparatus 100 performs a writing operation by the raster scan method which continuously irradiates shot beams in order, and when writing a desired pattern, a beam required according to a pattern is controlled to be ON by blanking control.

Figure 10:
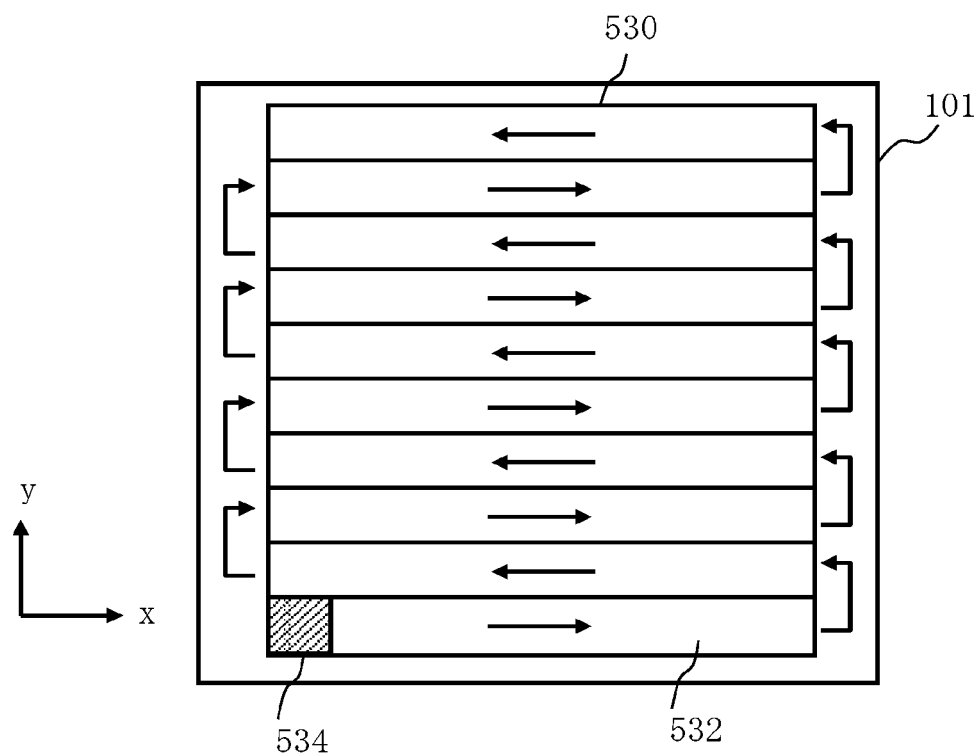
FIG. 10 is a conceptual diagram illustrating a writing operation according to the first embodiment.

FIG. 10 is a conceptual diagram illustrating a writing operation according to the first embodiment. As shown in FIG. 10, a writing region 530 of the target object 101 is virtually divided into a plurality of strip-shaped stripe regions 532 each having a predetermined width in the y direction, for example. Each of the stripe regions 532 serves as a writing unit region. The XY stage 105 is moved and adjusted such that an irradiation region 534 to be irradiated by one-time irradiation of the multi-beams 20 is located at the left end of the first stripe region 532 or at a position more left than the left end, and then writing is started. When writing the first stripe region 532, the writing advances relatively in the x direction by moving the XY stage 105 in the −x direction, for example. The XY stage 105 is continuously moved at a predetermined speed, for example. After writing the first stripe region 532, the stage position is moved in the −y direction and adjusted such that the irradiation region 534 is located at the right end of the second stripe region 532 or at a position more right than the right end and located to be relatively in the y direction. Then, similarly, writing advances in the −x direction by moving the XY stage 105 in the x direction, for example. That is, writing is performed while alternately changing the direction, such as performing writing in the x direction in the third stripe region 532, and in the −x direction in the fourth stripe region 532, and thus, the writing time can be reduced. However, the writing operation is not limited to the case of performing writing while alternately changing the direction, and it is also acceptable to perform writing in the same direction when writing each stripe region 532. By one shot, a plurality of shot patterns of the same number as the holes 22 are formed at a time by multi-beams which have been formed by passing through respective corresponding holes 22 of the forming aperture array member 203.

As described above, according to the first embodiment, since it is possible to attain bump mounting, impedance mismatch can be reduced. Therefore, since impedance matching can be easily achieved, signals are able to pass faster than the case of connection by wire bonding. Moreover, the number of contacts can be more than the case of wire bonding, which enables to increase the installation density. Furthermore, it is possible to suppress heat generation of the blanking aperture array device 204 by installing the receiver of differential signals outside the blanking aperture array device 204.

Second Embodiment

According to the first embodiment, circuit for exclusive use is formed in the circuit substrate 211, but it is not limited thereto. According to the second embodiment, there will be described a structure in which a substrate where an existing FPGA (Field Programmable Gate Array) is formed is used. Moreover, the structure of the writing apparatus 100 is the same as that of FIG. 1. The contents of the present embodiment are the same as those of the first embodiment except what is described below.

Figure 11:
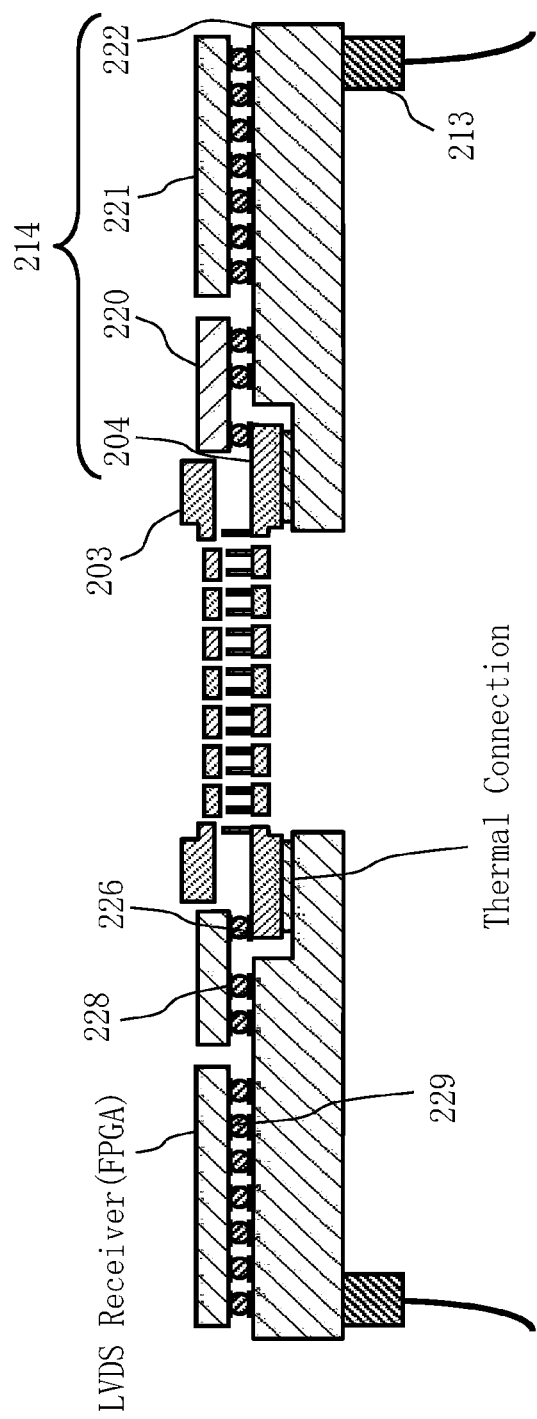
FIG. 11 is a sectional view showing a structure of a blanking system according to a second embodiment.

FIG. 11 is a sectional view showing a structure of a blanking system according to the second embodiment. In FIG. 11, the blanking system 214 for multi-beams according to the second embodiment includes the blanking aperture array device 204, a wiring substrate 220 (second substrate), an FPGA substrate 221 (third substrate), and a mounting substrate 222. The blanking aperture array device 204 is the same as that of FIG. 5. The central part of the mounting substrate 222 is open, and the blanking aperture array device 204 is arranged on the mounting substrate 222 such that the membrane region 30 of the blanking aperture array device 204 is located at the central opening. The lower surface of the wiring substrate 220 is electrically connected through a bump 226 to the substrate upper surface of the blanking aperture array device 204. The upper surface of the mounting substrate 222 is electrically connected through a bump 228 to the lower surface of the wiring substrate 220. The lower surface of the FPGA substrate 221 is electrically connected through a bump 229 to the upper surface of the mounting substrate 222. It is also preferable that the FPGA substrate 221 is arranged at the lower side of the mounting substrate 222 and the upper surface of the FPGA substrate 221 is electrically connected through a bump to the lower surface and of the mounting substrate 222.

According to the second embodiment, without arranging an active element, only wiring is formed on the wiring substrate 220 serving as a bridge substrate which bridges between the blanking aperture array device 204 and the mounting substrate 222. The FPGA substrate 221 on which the FPGA used as an active element is arranged is placed on the mounting substrate 222. In the second embodiment, the FPGA substrate 221 is used, in which an FPGA having a function of converting a differential signal into a single-ended signal is formed. The cost of the blanking system 214 can be reduced by using the existing circuit (FPGA) which already has a practical result as a conversion function for converting a differential signal into a single-ended signal. Other structures of the blanking system 214 are the same as those shown in FIGS. 4 to 6.

The irradiation time arrangement data of each group for each shot transmitted as a differential signal to the mounting substrate 222 from the deflection control circuit 130 is sent to the FPGA substrate 221 from the mounting substrate 222. In the FPGA substrate 221, the irradiation time arrangement data of each group is converted by FPGA into a single-ended signal from a differential signal. Then, the single-ended signal of each group is once transmitted to the mounting substrate 222, and then transmitted to the wiring substrate 220. In other words, a blanking signal for performing blanking control of a corresponding one of the multi-beams, using a corresponding one of the plurality of electrode groups, is transmitted to FPGA substrate 221 from the mounting substrate 222, and then, after being transmitted to the mounting substrate 222, is transmitted to the wiring substrate 220. Through the wiring in the wiring substrate 220, the single-ended signal of each group is transmitted to the head shift register 40 of a corresponding group through the pad 29 of each group of the blanking aperture array device 204, and then, sequentially transmitted to each of the shift registers 40 connected in series in the group concerned.

Embodiments have been explained referring to concrete examples described above. However, the present invention is not limited to these specific examples. While the case of inputting a 10-bit control signal into the shift register 40 has been described above, the number of bits may be suitably set. For example, a 1-bit or a 2-bit (to 9-bit) control signal may be used. Further, a control signal of 11-bit or more may also be used.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other blanking system for multi charged particle beams, multi charged particle beam writing apparatus, and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A blanking system for multi charged particle beams comprising:
    a blanking aperture array device configured to include a first substrate where a plurality of openings corresponding to passage positions of multi-beams are formed in a penetrating manner from an upper surface, and a plurality of electrode groups each having a pair of electrodes which are close to a corresponding one of the plurality of openings and are at opposite sides, on a same surface, of the corresponding one of the plurality of openings are arranged on the first substrate;
    a second substrate whose lower surface is electrically connected through a bump to an upper surface of the first substrate; and
    a mounting substrate whose upper surface is electrically connected through a bump to a lower surface of the second substrate,
    wherein the second substrate includes a conversion circuit that converts a differential signal into a single-ended signal.

2. The system according to claim 1,
    wherein the multi-beams are formed by letting charged particle beams pass through a forming aperture array member for forming multi-beams which is located above the blanking aperture array device, and
    wherein a height position of the bump connecting the second substrate and the blanking aperture array device is located lower than a lower surface of the forming aperture array member.

3. The system according to claim 1, wherein a blanking signal for performing blanking control of a corresponding one of the multi-beams, using a corresponding one of the plurality of electrode groups, is transmitted in order of the mounting substrate, the second substrate, and the first substrate.

4. The system according to claim 1, further comprising:
    a plurality of first pads arranged on an upper surface of a circumference region of the first substrate; and
    a plurality of second pads arranged on the lower surface of the second substrate, wherein
    the plurality of first pads and the plurality of second pads are connected by the bump.

5. The system according to claim 4, wherein
    the conversion circuit and a corresponding one of the plurality of second pads are electrically connected.

6. A blanking system for multi charged particle beams comprising:
    a blanking aperture array device configured to include a first substrate where a plurality of openings corresponding to passage positions of multi-beams are formed in a penetrating manner from an upper surface, and a plurality of electrode groups each having a pair of electrodes which are close to a corresponding one of the plurality of openings and are at opposite sides, on a same surface, of the corresponding one of the plurality of openings are arranged on the first substrate;
    a second substrate whose lower surface is electrically connected through a bump to an upper surface of the first substrate;
    a third substrate on which an FPGA (Field Programmable Gate Array) having a function of converting a differential signal into a single-ended signal is mounted; and
    a mounting substrate whose upper surface is electrically connected through a bump to lower surfaces of the second substrate and the third substrate.

7. The system according to claim 6, wherein a blanking signal for performing blanking control of a corresponding one of the multi-beams, using a corresponding one of the plurality of electrode groups, is transmitted to the third substrate from the mounting substrate, and then, after being transmitted to the mounting substrate, is transmitted to the first substrate.

8. A multi charged particle beam writing apparatus comprising:
    a stage configured to mount a target object thereon and to be continuously movable;
    an emitter configured to emit a charged particle beam;

a multi beam forming member, in which a plurality of openings are formed, configured to form multi-beams by making a region including a whole of the plurality of openings be irradiated by the charged particle beam and by making portions of the charged particle beam individually pass through a corresponding one of the plurality of openings;

a blanking system configured to perform blanking control of the multi-beams; and a limiting aperture member configured to block each beam having been deflected to be in an off state by the blanking system, wherein the blanking system includes a blanking aperture array device configured to include a first substrate where a plurality of openings corresponding to passage positions of multi-beams are formed in a penetrating manner from an upper surface, and a plurality of electrode groups each having a pair of electrodes which are close to a corresponding one of the plurality of openings and are at opposite sides, on a same surface, of the corresponding one of the plurality of openings are arranged;

a second substrate whose lower surface is electrically connected through a bump to an upper surface of the first substrate; and a mounting substrate whose upper surface is electrically connected through a bump to a lower surface of the second substrate, wherein the second substrate includes a conversion circuit that converts a differential signal into a single-ended signal.

* * * * *